US008135145B2

(12) United States Patent
Lin et al.

(10) Patent No.: US 8,135,145 B2
(45) Date of Patent: Mar. 13, 2012

(54) MULTI-LEVEL OUTPUT SIGNAL CONVERTER

(75) Inventors: Chun-Wei Lin, Yunlin County (TW); Yu-Cheng Lin, Yunlin County (TW); Bing-Shiun Hsieh, Yunlin County (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 319 days.

(21) Appl. No.: 12/507,463

(22) Filed: Jul. 22, 2009

(65) Prior Publication Data

US 2011/0019837 A1 Jan. 27, 2011

(51) Int. Cl.

| | |
|---|---|
| ***H04B 15/00*** | (2006.01) |
| *H03F 3/38* | (2006.01) |
| *H03F 1/04* | (2006.01) |
| *H03F 3/217* | (2006.01) |

(52) U.S. Cl. ..................... 381/94.2; 381/94.8; 381/94.5; 330/10; 330/251

(58) Field of Classification Search ........ 381/94.1–94.9; 370/360; 341/143; 455/3.6; 330/10, 251, 330/207 A See application file for complete search history.

(56) References Cited

U.S. PATENT DOCUMENTS

| | | | | |
|---|---|---|---|---|
| 7,224,219 | B2 * | 5/2007 | Spencer ......................... | 330/10 |
| 7,843,260 | B2 * | 11/2010 | Kotowski et al. ............... | 330/10 |
| 2006/0038710 | A1 * | 2/2006 | Staszewski et al. ........... | 341/143 |

* cited by examiner

*Primary Examiner* — Fan Tsang
*Assistant Examiner* — Eugene Zhao
(74) *Attorney, Agent, or Firm* — Muncy, Geissler, Olds & Lowe, PLLC

(57) ABSTRACT

The present invention discloses a multi-level output signal converter, which is connected to an audio amplifier. The audio amplifier comprises a comparing/measuring device, an encoder and an output unit. The multi-level output signal converter comprises a timing processing unit and a multi-level converter. The timing processing unit is connected to the comparing/measuring device and the encoder. The timing processing unit includes a plurality of flip-flops and a timing summing element. The flip-flop receives a first signal from the comparing/measuring device and outputs the first signal to the timing summing element. The encoder converts the first signal into a second signal. The multi-level converter is connected to the encoder and the output unit. The encoder transmits the second signal to the multi-level converter, and the multi-level converter thus outputs a third signal to the output unit.

9 Claims, 8 Drawing Sheets

MULTI-LEVEL OUTPUT SIGNAL CONVERTER

FIELD OF THE INVENTION

The present invention relates to a technology for improving audio output distortion, particularly to a multi-level output signal converter, which can improve audio output distortion.

BACKGROUND OF THE INVENTION

Currently, the related manufacturers have a trend to fabricate slim, compact and portable multimedia products. The batteries of multimedia products should have long running time to benefit portability. High fidelity and high sampling rate can effectively promote the audio quality of multimedia products.

The class A amplifier is essentially used in high-end audio devices and features very low audio distortion. However, the class A amplifier has a very high power consumption. The class A amplifier uses active elements, and the elements are biased at the linear working range thereof. In other words, the bias working point is set at the nearby of the middle point of the load line. The class A amplifier is turned on in the entire cycle of signal input. When no signal is input, the class A amplifier is still turned on. Therefore, the class A amplifier has a very low power efficiency—only about 25% theoretically. Because of high power consumption, the class A amplifier needs a large heat sink to dissipate heat.

The class B amplifier uses dynamic input signals to turn on/off the transistors, and the bias working point is almost zero. When no signal is input, the output terminals almost consume none energy. Therefore, the class B amplifier has higher power efficiency—about 78.5% theoretically. Because of non-conduction of the transistors QN and QP, the class B amplifier has a non-linear working area and thus has serious crossover distortion.

The class AB amplifier works and functions between the class A amplifier and the class B amplifier. The class AB amplifier uses two diodes to vary the bias working point and eliminate the crossover distortion appeared in the class B amplifier with a penalty of having power efficiency lower than the class B amplifier. The class AB amplifier has the advantages of a lower quiescent current (lower quiescent power consumption) than the class A amplifier and a lower distortion than the class B amplifier. However, the class AB amplifier has the disadvantage of quiescent power consumption higher than the class B amplifier. Therefore, the class AB amplifier needs an additional heat sink.

The abovementioned amplifiers are all traditional linear amplifiers except the bias working points thereof are different. The class D amplifier is a switching amplifier completely distinct from the traditional linear amplifiers.

In comparison with the linear amplifiers, the class D amplifier has very high power efficiency—100% theoretically. Because of high power efficiency, the class D amplifier generates less heat, and none additional heat sink is needed. Therefore, the class D amplifier can be economically manufactured and is widely used.

Refer to FIG. 1 for a conventional class D amplifier. The conventional class D amplifier is very suitable for compact and portable electronic products. The class D amplifier comprises a modulation circuit 1, an amplifier circuit 2 and a low pass filter 3. The modulation circuit 1 usually has the PWM (Pulse Width Modulation) function and the SDM (Sigma Delta Modulation) function. The modulation circuit 1 converts an input audio signal 5 into a pulse width-based two-level voltage signal 6, and the pulse width-based two-level voltage signal 6 is used to control the turn-on/turn-off of the amplifier circuit 2. Then, the signal is restored by the low pass filter 3 and output by a speaker 4.

The input audio signal 5 is converted by the modulation circuit 1 into the pulse width-based two-level voltage signal 6, and the pulse width-based two-level voltage signal 6 is amplified by the amplifier circuit 2. After amplified, the signal is still a two-level voltage signal 6. The low pass filter 3 filters out the high-frequency harmonic and decreases the affection of noise and electromagnetic interference. In the time domain, the low pass filter 3 functions like an integrator, gradually accumulating or releasing the signal levels or signal energy to restore the modulated signal.

The two-level voltage signal 6 has very great instantaneous voltage difference. Thus, the low pass filter 3 is hard to accumulate energy synchronously, and the signals are likely to have a phase difference. Therefore, the output signal has distortions 7 and cannot be restored into the audio voltage signal in high fidelity and low distortion. Compared with the sinusoidal input audio signal 5, the two-level voltage signal 6 has many distortions 7.

SUMMARY OF THE INVENTION

The primary objective of the present invention is to provide a multi-level output signal converter to improve the problem of audio distortion.

To achieve the abovementioned objective, the present invention proposes a multi-level output signal converter, which is connected to an audio amplifier. The audio amplifier comprises a comparing/measuring device, an encoder and an output unit. The multi-level output signal converter comprises a timing processing unit and a multi-level converter. The timing processing unit is connected to the comparing/measuring device and the encoder. The timing processing unit includes a plurality of flip-flops and a timing summing element. The flip-flop receives a first signal from the comparing/measuring device and output the first signal to the timing summing element. The encoder converts the first signal into a second signal. The multi-level converter is connected to the encoder and the output unit. The encoder transmits the second signal to the multi-level converter, and the multi-level converter thus outputs a third signal to the output unit.

The multi-level output signal converter has several advantages.

1. The present invention can increase the resolution of the two-level voltage signal 6 of the modulation circuit 1 (refer to FIG. 1). The present invention can also improve the problem of insufficient resolution occurring after the two-level voltage signal 6 has been amplified by the amplifier circuit 2. The present invention, which has a timing processing unit and a multi-level converter, can thus effectively promote the resolution of a third signal output by the present invention.

The present invention is designed to have a timing processing unit and a multi-level converter. A first signal is processed by the timing processing unit and transmitted to the encoder become a second signal. The second signal is converted by the multi-level converter from a two-level high-level difference voltage signal into the multi-level low-level difference third signal.

Thereby, the present invention can simplify the design of the low pass filter 3 (refer to FIG. 1). Further, the present invention can obviously lower the high-frequency harmonic interference, greatly decrease the signal distortions 7 caused by the amplifier circuit 2, and effectively promote signal resolution.

2. The present invention can achieve higher signal resolution and better linearity. Therefore, the present invention can effectively improve SNR (Signal Noise Ratio) and greatly decrease THD (Total Harmonic Distortion). Further, the present invention can promote the power efficiency and signal fidelity of the audio amplified system. Furthermore, the present invention can decrease the power of the high-frequency band in the transmission or generation of the frequency spectrum, lower the switching frequency and reduce the switching loss. Moreover, the present invention can effectively lessen the affection of electromagnetic interference and promote the output power efficiency.

DETAILED DESCRIPTION OF THE PREFERRED EMBODIMENTS

Below, the technical contents of the present invention are described in detail with the embodiments. However, the embodiments are only to exemplify the present invention but not to limit the scope of the present invention.

Figure 2:
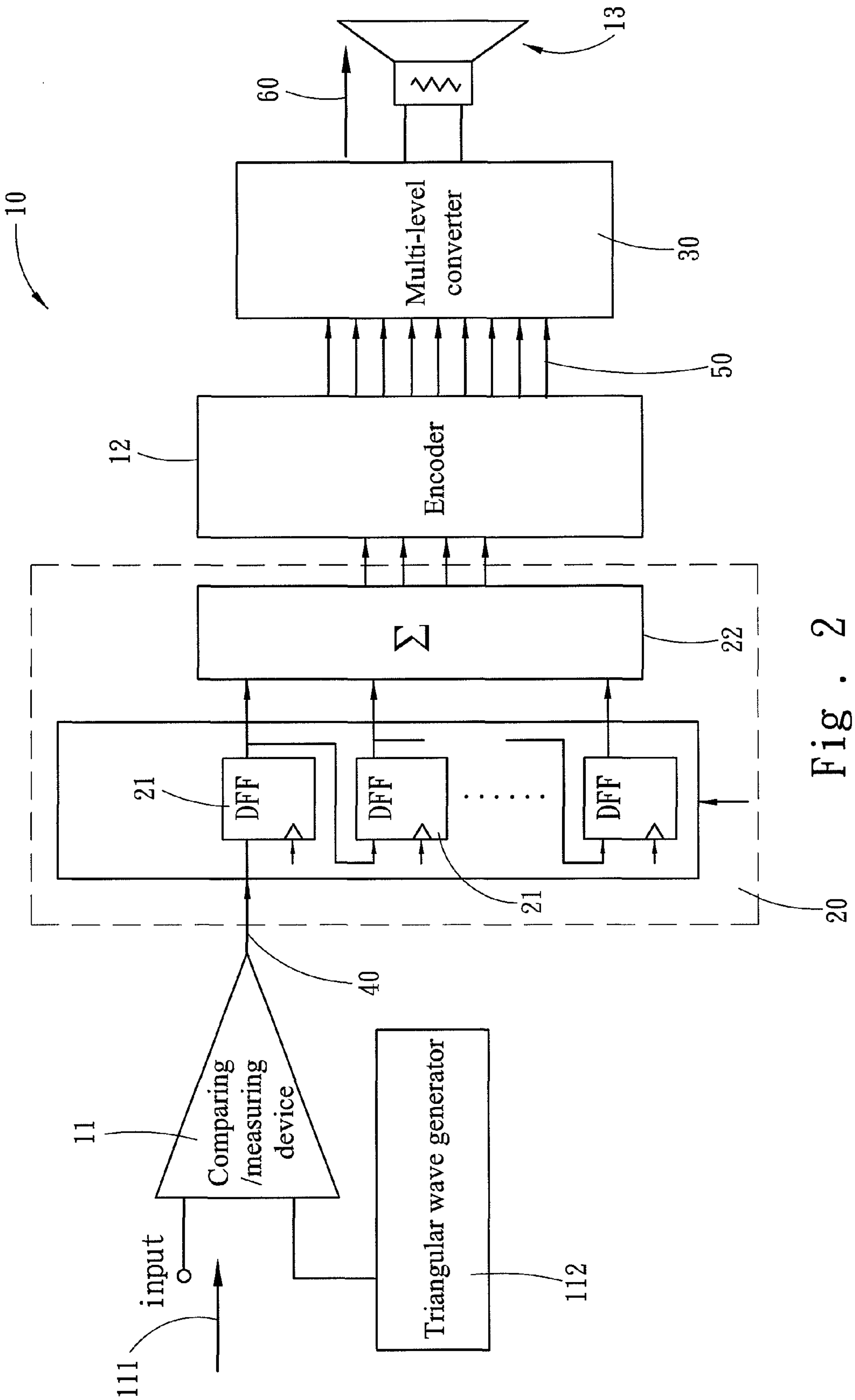
FIG. 2 is a block diagram schematically showing the architecture of a multi-level output signal converter according to the present invention.
Figure 3:
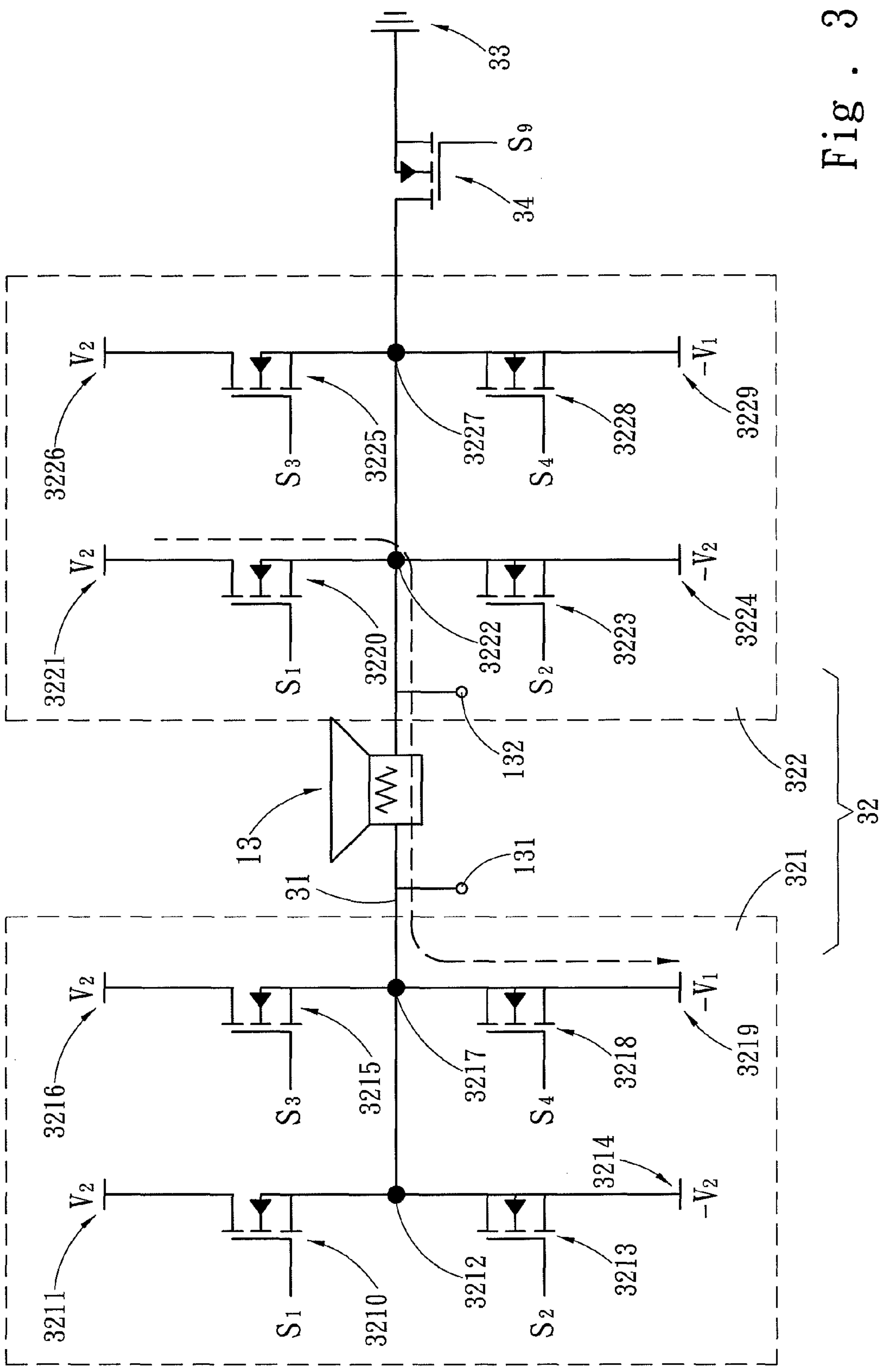
FIG. 3 is a circuit diagram of a multi-level converter according to the present invention.

Refer to FIG. 2 and FIG. 3. FIG. 2 is a block diagram schematically showing a multi-level output signal converter according to the present invention. FIG. 3 is a circuit diagram of a multi-level converter according to the present invention. The present invention proposes a multi-level output signal converter, which is connected to an audio amplifier 10. The audio amplifier 10 comprises a comparing/measuring device 11, an encoder 12 and an output unit 13. The multi-level output signal converter comprises a timing processing unit 20 and a multi-level converter 30. The timing processing unit 20 is connected to the comparing/measuring device 11 and the encoder 12. The timing processing unit 20 includes a plurality of flip-flops 21 and a timing summing element 22. The flip-flop 21 receives a first signal 40 from the comparing/measuring device 11 and output the first signal to the timing summing element 22. The encoder 12 converts the first signal into a second signal 50. The multi-level converter 30 is connected to the encoder 12 and the output unit 13. The encoder 12 transmits the second signal 50 to the multi-level converter 30, and the multi-level converter 30 thus outputs a third signal 60 to the output unit 13.

The comparing/measuring device 11 receives an analog signal 111 and a signal output by a triangular wave generator 112 to generate the first signal 40. The timing summing element 22 is a logic gate. The output unit 13 is a speaker, a loudspeaker, or a megaphone.

As shown in FIG. 3, the output unit 13 is connected to a plurality of full-bridge circuits 32 via a switch line 31. The full-bridge circuit 32 further comprises a first full-bridge circuit 321 and a second full-bridge circuit 322. The output unit 13 has a first load terminal 131 and a second load terminal 132 on the switch line 31. The first load terminal 131 is connected to the first full-bridge circuit 321 on the switch line 31, and the second load terminal 132 is connected to the second full-bridge circuit 322 on the switch line 31.

The first full-bridge circuit 321 includes a first switch transistor 3210, a second switch transistor 3213, a third switch transistor 3215, and a fourth switch transistor 3218.

The first switch transistor 3210 has a first terminal and a second terminal. The first terminal of the first switch transistor 3210 receives a first voltage 3211. The second terminal of the first switch transistor 3210 is connected to a first terminal point 3212 of the switch line 31. The first switch transistor 3210 is controlled by the second signal 50.

The second switch transistor 3213 has a first terminal and a second terminal. The first terminal of the second switch transistor 3213 receives a second voltage 3214. The second terminal of the second switch transistor 3213 is connected to the first terminal point 3212. The second switch transistor 3213 is controlled by the second signal 50.

The third switch transistor 3215 has a first terminal and a second terminal. The first terminal of the third switch transistor 3215 receives a third voltage 3216. The second terminal of the third switch transistor 3215 is connected to a second terminal point 3217. The third switch transistor 3215 is controlled by the second signal 50.

The fourth switch transistor 3218 has a first terminal and a second terminal. The first terminal of the fourth switch transistor 3218 receives a fourth voltage 3219. The second terminal of the fourth switch transistor 3218 is connected to the second terminal point 3217. The fourth switch transistor 3218 is controlled by the second signal 50.

The second full-bridge circuit 322 includes a fifth switch transistor 3220, a sixth switch transistor 3223, a seventh switch transistor 3225, and an eighth switch transistor 3228.

The fifth switch transistor 3220 has a first terminal and a second terminal. The first terminal of the fifth switch transistor 3220 receives a fifth voltage 3221. The second terminal of the fifth switch transistor 3220 is connected to a third terminal point 3222 of the switch line 31. The fifth switch transistor 3220 is controlled by the second signal 50.

The sixth switch transistor 3223 has a first terminal and a second terminal. The first terminal of the sixth switch transistor 3223 receives a sixth voltage 3224. The second terminal of the sixth switch transistor 3223 is connected to the third terminal point 3222. The sixth switch transistor 3223 is controlled by the second signal 50.

The seventh switch transistor 3225 has a first terminal and a second terminal. The first terminal of the seventh switch transistor 3225 receives a seventh voltage 3226. The second terminal of the seventh switch transistor 3225 is connected to a fourth terminal point 3227. The seventh switch transistor 3225 is controlled by the second signal 50.

The eighth switch transistor 3228 has a first terminal and a second terminal. The first terminal of the eighth switch transistor 3228 receives an eighth voltage 3229. The second terminal of the eighth switch transistor 3228 is connected to the fourth terminal point 3227. The eighth switch transistor 3228 is controlled by the second signal 50.

The switch line 31 is further connected to a ground connection 33. A ninth switch transistor 34 is arranged between the second full-bridge circuit 322 and the ground connection 33.

Figure 4:
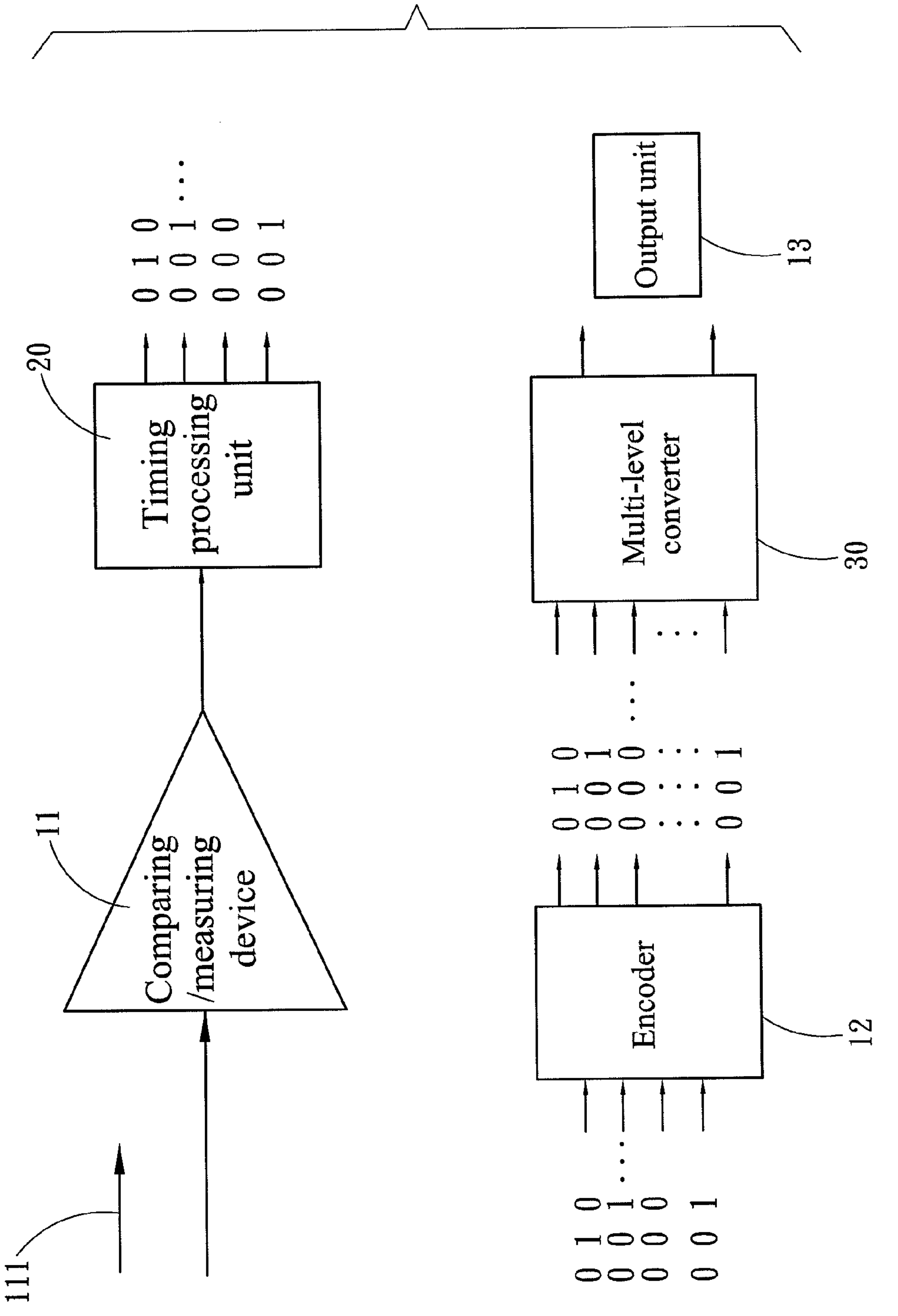
FIG. 4 is a diagram schematically showing the relationship of the input signals and the output signals according to the present invention.

Refer to FIG. 4 a diagram schematically showing the relationship of the input signals and the output signals according to the present invention. The present invention is intended to overcome the problems of the conventional technologies. When the adjacent voltage differences become closer and the voltage difference becomes smaller, the present invention can promote the resolution of the conventional class D amplifier 10, decrease total harmonic distortion, and lessen electromagnetic interference. The comparing/measuring device 11 modulates the analog signal 111 into the first signal 40. Next, the timing processing unit 20 converts the first signal 40 into a binary code. Next, the encoder 12 transforms the binary code into the second signal 50 required by the multi-level converter 30. Then, the multi-level converter 30 transforms the second signal 50 into the third signal 60.

Figure 1:
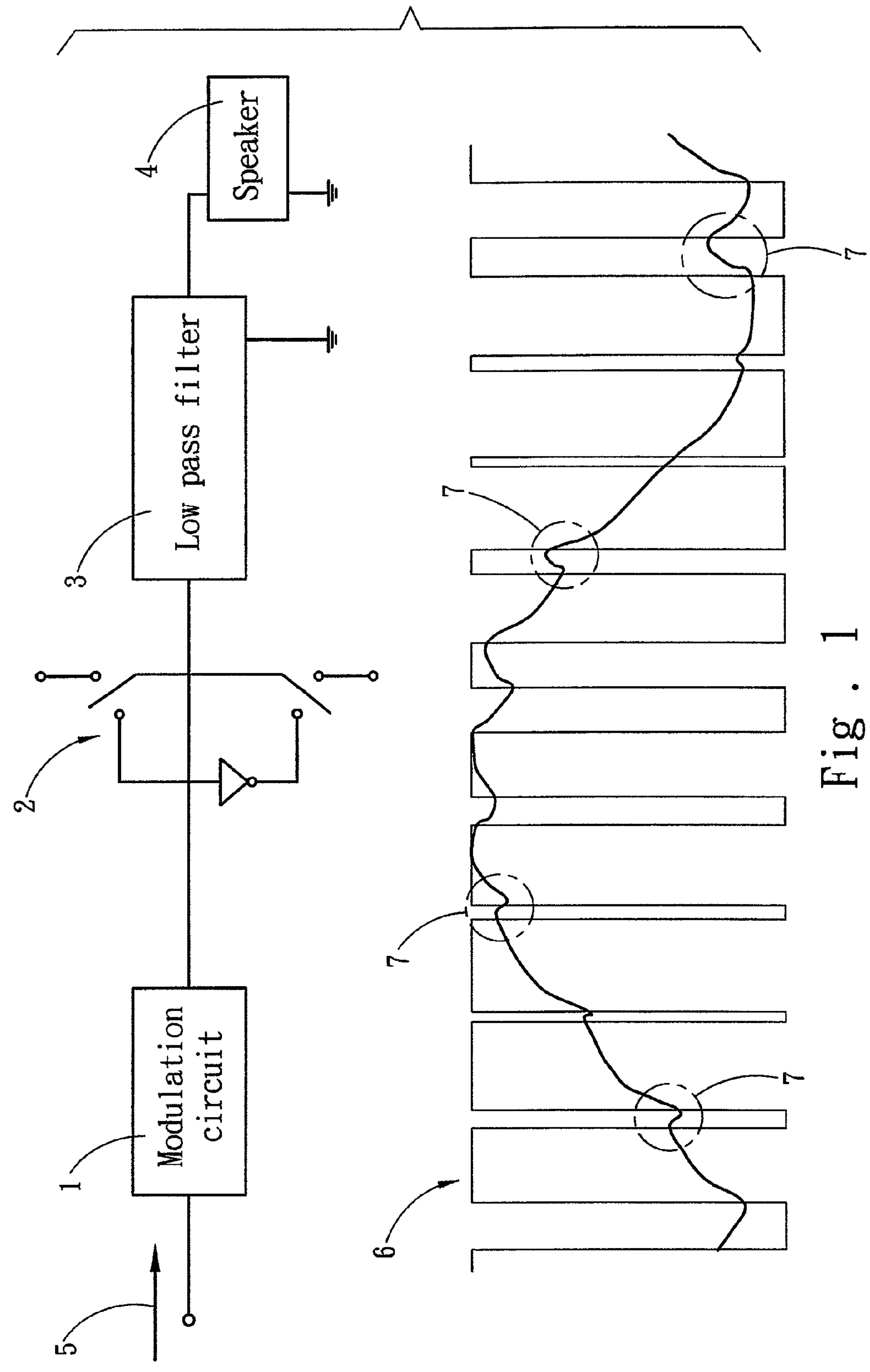
Fig. 1 PRIOR ART
FIG. 1 is a diagram schematically showing the operation of a conventional class D amplifier.
Figure 5:
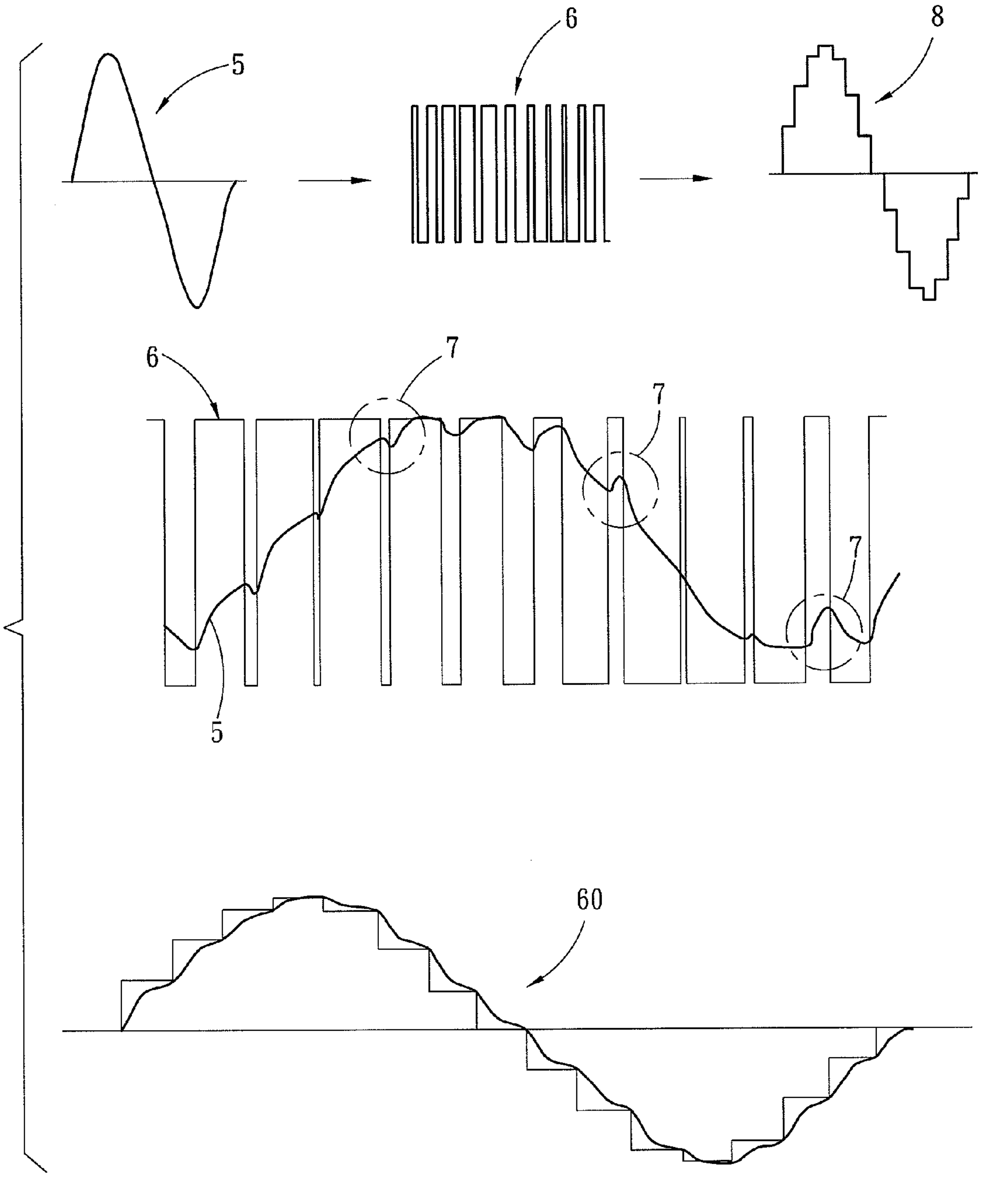
FIG. 5 is a diagram for comparing signals.
Figure 6:
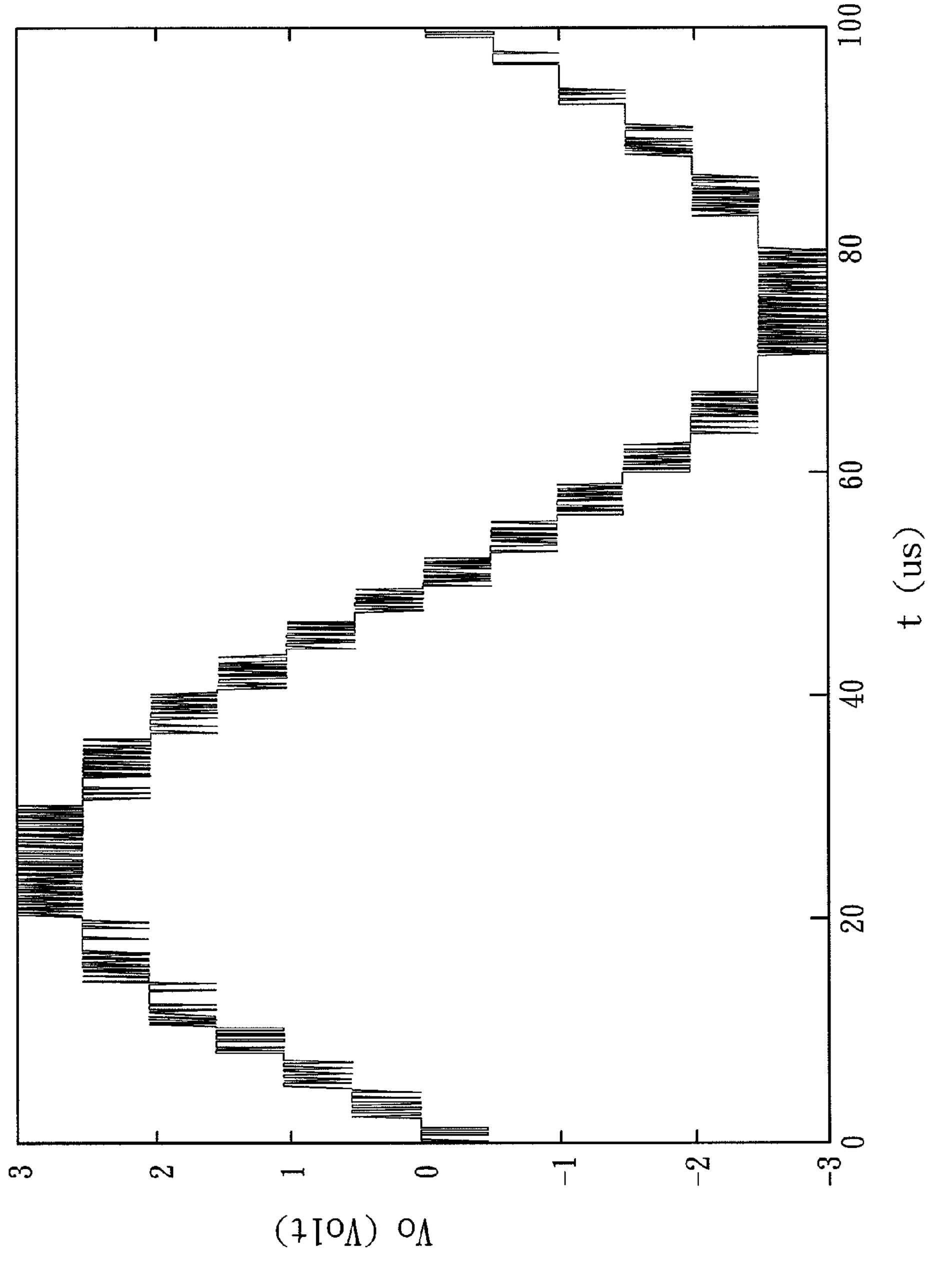
FIG. 6 is a diagram schematically showing the signal output by the circuit according to the present invention.

Refer to FIG. 1, FIG. 5, and FIG. 6. FIG. 5 is a diagram comparing signals. FIG. 6 is a diagram schematically showing the signal output by the circuit. The input audio signal 5 is modulated by the PWM circuit of the modulation circuit 1 into a pulse width-based two-level voltage signal 6. As shown in FIG. 1 and FIG. 5, the pulse width-based two-level voltage signal 6 is amplified by the amplifier circuit 2. After amplified, the signal is still a pulse width-based two-level voltage signal 6. The two-level voltage signal 6 has very great instantaneous voltage difference. Thus, the low pass filter 3 is hard to accumulate signal energy synchronously, and the signals are likely to have a phase difference and signal distortions 7. Thus, the signal output by the conventional technology is a low-fidelity and high-distortion multi-level output converted signal 8.

The principle of the present invention is to transform the coordinate axis of the input signal to promote signal resolution and achieve low distortion and high fidelity in signal amplification or signal transformation. The present invention uses the timing processing unit 20 and the multi-level converter 30 to transform the input audio signal 5 (as shown in FIG. 1) and the analog signal 111 (as shown in FIG. 2) into a multi-level third signal (as shown in FIG. 2 and FIG. 4), whereby the signal resolution is promoted.

Figure 7:
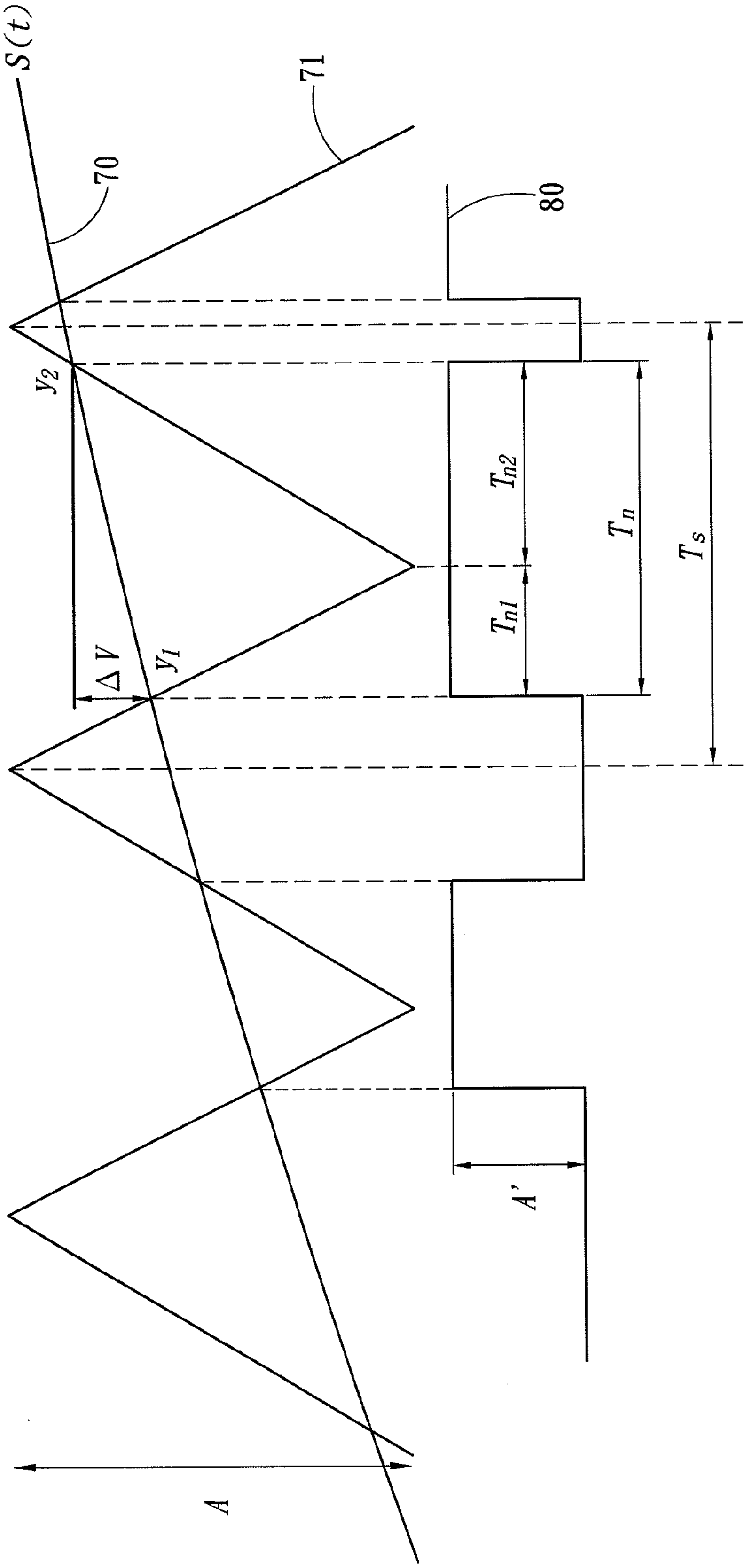
FIG. 7 is a diagram schematically showing the relationship of the input signal and PWM.

Refer to FIG. 7 a diagram schematically showing the relationship of the input signal and pulse width modulation. According to FIG. 7, the relationship of an input voltage signal 70, a triangular wave sampling signal 71 and the duty ratio 80 of a pulse signal is derived as follows:

$$\frac{dS(t)}{dt} = \frac{\Delta V}{t_n}$$

wherein S(t) is the input voltage signal 70.

Then, the following two equations are derived according to the concept of slope differential:

$$\frac{t_{n1}}{0.5Ts} = \frac{y_1}{A}$$

$$\frac{t_{n2}}{0.5Ts} = \frac{y_2}{A}$$

Then, arrange the above equations as follows:

$$y_1 = \frac{A \cdot t_{n1}}{0.5Ts}$$

$$y_2 = \frac{A \cdot t_{n2}}{0.5Ts}$$

Via substitution is obtained the following equation:

$$y' = \frac{y_1 + y_2}{2} = \frac{1}{2}\frac{A(t_{n1} + t_{n2})}{0.5Ts} = \frac{A \cdot t_n}{Ts} = A \cdot D$$

wherein D is the duty ratio 80 of the pulse signal.

After deduction, it is obtained that the duty ratio 80 of the pulse signal is proportional to the average of the input voltage signal 70. In other words, it is proved that the input voltage signal 70 is proportional to the traditional PWM signal.

Figure 8:
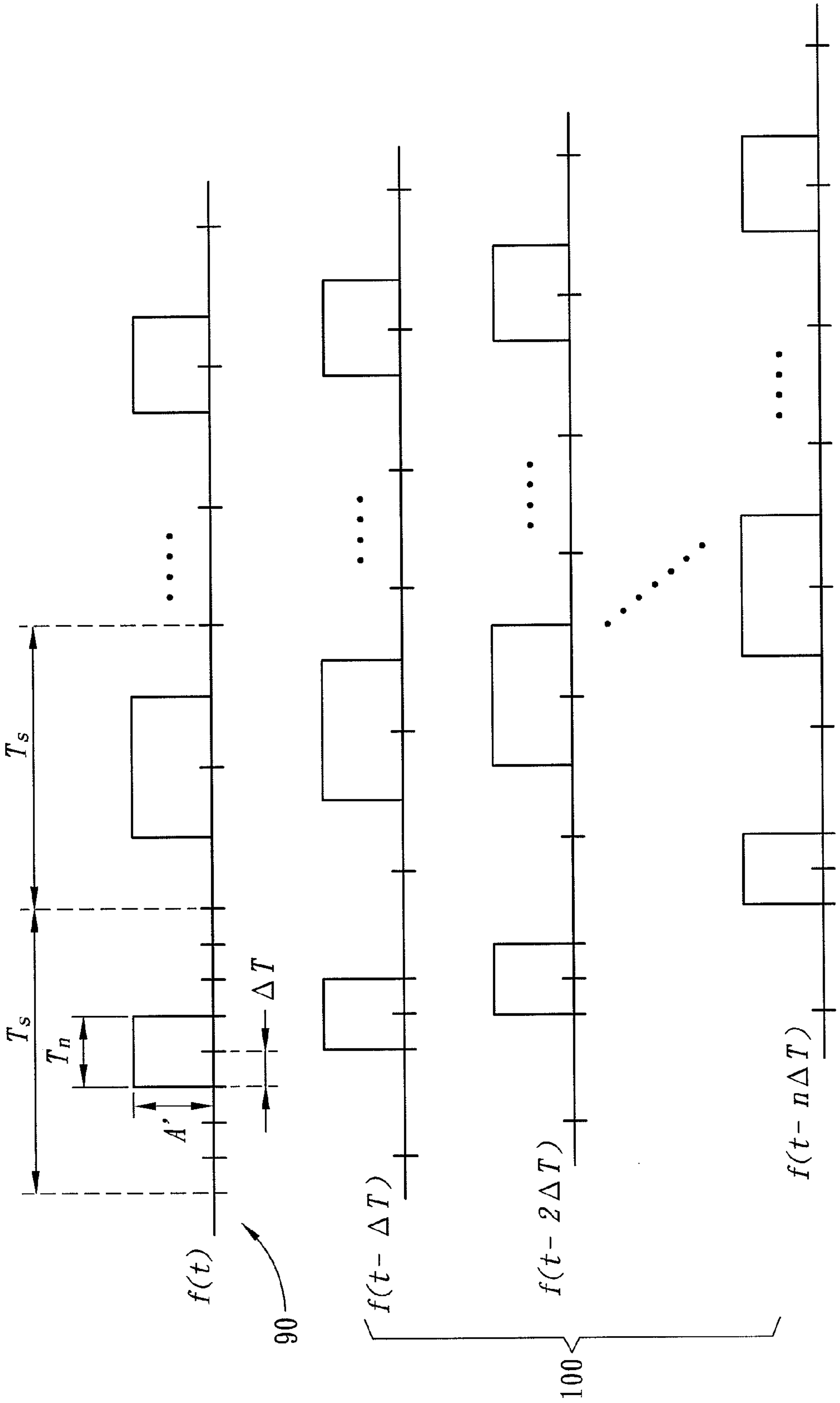
FIG. 8 is a diagram schematically showing the relationship of the input signal and the multi-level output modulation.

Refer to FIG. 8 for the relationship of the input signal and the multi-level output modulation. The total average of the PWM signal 90 of a complete sampling cycle and several PWM delay signals 100 can be derived as follows:

$$\begin{aligned}
m(t)_{AVE} &= \frac{1}{T_s}\int_0^{T_s} m(t)dt \\
&= \frac{1}{T_s}\int_0^{T_s}\left[f(t) + f\left(t - \frac{T_s}{M}\right) + \ldots + f\left(t - \frac{(M-1)T_s}{M}\right)\right]dt \\
&= \frac{1}{T_s}\int_0^{T_s}\sum_{k=0}^{M-1} f\left(t - \frac{kT_s}{M}\right)dt \\
&= \frac{1}{T_s}\sum_{k=0}^{M-1}\int_0^{T_s} f\left(t - \frac{kT_s}{M}\right)dt \\
&= \frac{1}{T_s}\sum_{k=0}^{M-1}\int_0^{T_n} A'dt \\
&= \frac{1}{T_s}\sum_{k=0}^{M-1} A't_n \\
&= A'M\frac{t_n}{T_s} \\
&= A' \cdot M \cdot D,
\end{aligned}$$

wherein D is the duty ratio.

In FIG. 7, the duty ratio 80 of the pulse signal is proportional to the average of the input voltage signal 70. Therefore, they also have a relationship of proportionality in FIG. 8.

As shown in FIG. 5, the amplitude of the input audio signal 5 represents the value of the voltage in the conventional technology. After modulation of the input audio signal 5 are formed the two-level voltage signal 6 and the multi-level output converted signal 8, wherein the width of the pulse represents the value of the voltage, and wherein the multi-value output converted signal 8 has high distortion and low fidelity. Via the application of the present invention is formed the third signal 60 simultaneously using the amplitude and pulse width to represent the value of the voltage. The multi-level output signal converter of the present invention can simplify the design of the low pass filter 3 and decrease the signal distortions 7 of the restored signal. Thus, the third signal 60 has a smoother waveform.

In conclusion, the present invention can increase the resolution of the two-level voltage signal 6 of the modulation circuit 1 (as shown in FIG. 1); the present invention can also improve the problem of insufficient resolution occurring after the two-level voltage signal 6 has been amplified by the amplifier circuit 2 (as shown in FIG. 5). The present invention is designed to have a timing processing unit 20 and a multi-level converter 30. The multi-level converter 30 has a full-bridge circuit 32 containing a first full-bridge circuit 321 and a second full-bridge circuit 322 each having four switch transistors (as shown in FIG. 3). The two groups of switch transistors have sixteen variations. Therefore, the present invention can make the third signal 60 more delicate (as shown in FIG. 5) and effectively promote the resolution of the third signal 60.

The first signal 40 is processed by the timing processing unit 20 and the encoder 12 into the second signals 50. The second signal 50 is converted by the multi-level converter 30 from a two-level high-level difference voltage signal into the multi-level low-level difference third signal 60. Thereby, the design of the low pass filter 3 (as shown in FIG. 1) in the conventional technology is simplified, the high-frequency harmonic interference is obviously lessened, and the signal distortions 7 caused by the amplifier circuit 2 is greatly decreased, and the signal resolution is effectively promoted.

The present invention can achieve higher signal resolution and better linearity. Therefore, the present invention can effectively improve SNR (Signal Noise Ratio) and greatly decrease THD (Total Harmonic Distortion). Further, the present invention can promote the power efficiency and signal fidelity of the audio amplified system. Furthermore, the present invention can decrease the power of the high-frequency band, lower the switching frequency and reduce the switching loss. Moreover, the present invention can effectively lessen electromagnetic interference.

What is claimed is:

1. A multi-level output signal converter, which is connected to an audio amplifier including a comparing/measuring device, an encoder and an output unit, comprising:

a timing processing unit connected to said comparing/measuring device and said encoder, and including a plurality of flip-flops and a timing summing element, wherein said flip-flop receives a first signal from said comparing/measuring device and outputs said first signal to said timing summing element, and said encoder converts said first signal into a second signal; and a multi-level converter connected to said encoder and said output unit, receiving said second signal from said encoder, converting said second signal into a third signal, and outputting said third signal to said output unit.

2. The multi-level output signal converter according to claim 1, wherein said comparing/measuring device receives an analog signal and a signal output by a triangular wave generator and generates said first signal.

3. The multi-level output signal converter according to claim 1, wherein said output unit is a speaker, a loudspeaker, or a megaphone.

4. The multi-level output signal converter according to claim 1, wherein said timing summing element is a logic gate.

5. The multi-level output signal converter according to claim 1, wherein said output unit is connected to a plurality of full-bridge circuits via a switch line; said full-bridge circuit contains a first full-bridge circuit and a second full-bridge circuit.

6. The multi-level output signal converter according to claim 5, wherein said output unit has a first load terminal and a second load terminal on said switch line; said first load terminal is connected to said first full-bridge circuit on said switch line; said second load terminal is connected to said second full-bridge circuit on said switch line.

7. The multi-level output signal converter according to claim 6, wherein said first full-bridge circuit includes a first switch transistor having a first terminal receiving a first voltage and a second terminal connected to a first terminal point of said switch line, and controlled by said second signal;

a second switch transistor having a first terminal receiving a second voltage and a second terminal connected to said first terminal point of said switch line, and controlled by said second signal;

a third switch transistor having a first terminal receiving a third voltage and a second terminal connected to a second terminal point of said switch line, and controlled by said second signal; and a fourth switch transistor having a first terminal receiving a fourth voltage and a second terminal connected to said second terminal point of said switch line, and controlled by said second signal.

8. The multi-level output signal converter according to claim 6, wherein said second full-bridge circuit includes a fifth switch transistor having a first terminal receiving a fifth voltage and a second terminal connected to a third terminal point of said switch line, and controlled by said second signal;

a sixth switch transistor having a first terminal receiving a sixth voltage and a second terminal connected to said third terminal point of said switch line, and controlled by said second signal;

a seventh switch transistor having a first terminal receiving a seventh voltage and a second terminal connected to a fourth terminal point of said switch line, and controlled by said second signal; and an eighth switch transistor having a first terminal receiving an eighth voltage and a second terminal connected to said fourth terminal point of said switch line, and controlled by said second signal.

9. The multi-level output signal converter according to claim 1, wherein said switch line is further connected to a ground connection; a ninth switch transistor is arranged between said second full-bridge circuit and said ground connection.

* * * * *